United States Patent
Pelloquin et al.

(10) Patent No.: US 9,620,581 B2
(45) Date of Patent: Apr. 11, 2017

(54) MULTILAYER ELECTRICAL DEVICE

(71) Applicant: Commissariat a L'Energie Atomique et aux Energies Alternatives, Paris (FR)

(72) Inventors: Sylvain Pelloquin, Grenoble (FR); Christel Dieppedale, Crolles (FR); Gwenael Le Rhun, Renage (FR); Henri Sibuet, La Buisse (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/735,584

(22) Filed: Jun. 10, 2015

(65) Prior Publication Data

US 2015/0357401 A1    Dec. 10, 2015

(30) Foreign Application Priority Data

Jun. 10, 2014    (FR) ..................... 14 55212

(51) Int. Cl.
| | |
|---|---|
| H01L 49/02 | (2006.01) |
| C25D 5/02 | (2006.01) |
| H01G 4/30 | (2006.01) |
| H01G 4/005 | (2006.01) |
| H01L 23/64 | (2006.01) |

(52) U.S. Cl.
CPC ............. H01L 28/60 (2013.01); C25D 5/022 (2013.01); H01G 4/005 (2013.01); H01G 4/306 (2013.01); H01L 23/642 (2013.01); H01L 2924/0002 (2013.01)

(58) Field of Classification Search
CPC ................. H01L 28/40; H01L 28/60; H01L 28/86–28/88; H01L 23/642; H01G 4/306
See application file for complete search history.

(56) References Cited

U.S. PATENT DOCUMENTS

| | | | |
|---|---|---|---|
| 5,745,335 A |   | 4/1998 | Watt |
| 6,411,494 B1 | * | 6/2002 | Watt .................. H01L 23/49822 257/E23.062 |
| 2004/0152258 A1 |   | 8/2004 | Kiyotoshi |
| 2006/0138595 A1 |   | 6/2006 | Kiyotoshi |
| 2008/0032481 A1 |   | 2/2008 | Kiyotoshi |
| 2010/0044831 A1 |   | 2/2010 | Guegan |
| 2011/0233722 A1 |   | 9/2011 | Liang et al. |

OTHER PUBLICATIONS

French Preliminary Search Report issued Jan. 26, 2015 in French Application 14 55212, filed on Jun. 10, 2014 (with English Translation of Categories of Cited Documents and Written Opinion).

* cited by examiner

*Primary Examiner* — Dale E Page
*Assistant Examiner* — John Bodnar
(74) *Attorney, Agent, or Firm* — Oblon, McClelland, Maier & Neustadt, L.L.P.

(57) ABSTRACT

A method and an electrical device with superimposed layers in an alternation of conductive layers and insulating layers. A mesa-type structure is formed, leaving for at least one conductive layer, an uncovered peripheral portion accessible for connection. In this portion, an electrically insulating pattern is configured in order to mark out an electrically insulated area located in the peripheral portion of said at least one of the electrically conductive layers. Application to electrical capacitances and redistribution layers for microelectronic devices.

6 Claims, 4 Drawing Sheets

MULTILAYER ELECTRICAL DEVICE

TECHNICAL FIELD OF THE INVENTION

The present invention concerns in general formation of multilayer electrical devices alternating insulating and conductive layers and more specifically but non-restrictively, production of multilayer capacitances or dense routing structures. A possible application refers to devices based on semiconductor materials.

It allows, for example, production of an electrostatic device by alternate stacking of conductive and dialectric layers that can be advantageously connected to a small number of lithographic masks. This type of device is particularly suitable for production by microelectronic technology, which includes nanotechnologies. The invention allows access to a high surface charge density using a low-cost manufacturing technology.

The invention may also be used to perform electricity line redistributions using the property of superimposition of said lines in order to benefit from a gain in surface area and therefore a reduction in cost.

STATE OF THE ART

The microelectronic industry commonly uses layered structures of the metal-insulator-metal (MIM) type wherein layers, which are alternatively insulating and conductive on an electrical level, are stacked particularly in order to form high-value capacitances at reasonable costs owing to the saving in surface area that superimposition of these layers allows.

Structures of this type have already been described, particularly those described in document U.S. Pat. No. 5,745,335. This publication provides an account of a manufacturing process of a capacitive system on top of a substrate. Manufacture begins by full-plate alternate deposition of several stacks, each comprising an electrically conductive layer and an electrically insulating layer. These several layers deposited are subsequently etched in order to mark out, for each stack, an electrode pattern. The result is creation of several electrode levels on top of the face of the substrate on which the deposits have been made. In said superposition, the electrode patterns are different in order to allow recovery of contact for connection of the conductive layer of each stack to an external element. More specifically, one starts by etching the uppermost stack, imparting a shape and thus an outline and a determined surface area. Successive etchings are subsequently performed for the stacks of the lower levels. This manufacture in which the electrodes are gradually formed by progressing stepwise down to the surface of the substrate is also known as "top down" in the literature. These etchings are configured in such a way that between two successive levels, the upper stack has a strictly smaller surface area than that of the lower stack and therefore the upper stack has an outline contained within the boundary of the lower stack. The stacked structure is of increasing section in the direction of the substrate on which it is superimposed and resembles a "mesa-type structure".

Hence, for each stack, a lateral part not covered by its conductive layer is provided, thereby allowing an access for recovery of contact. The embodiment proposed by U.S. Pat. No. 5,745,335 therefore provides a possibility of lateral restorations of contact in order to form the capacitor electrodes. The contact restorations are effected by contact elements passing through a dielectric layer covering the stacked structure, each of which is provided with an electrical connection end applied to a conductive layer of a stack (on the edge of the conductive layer not covered by the layers superimposed thereon) and an external connection end.

This type of stack structure has advantages in terms of manufacture and formation of the contact restorations. The successive etchings, on the sidewalls of each stack formed of a conductive layer and an insulating layer, may however create electrically defective areas on the etching sidewalls. These defective areas result in a shortfall in the performances and a loss of reliability of the device, due in particular to the industrial reproducibility issues of this manufacturing method.

A capacitive structure comprising a stack of several electrodes based on a semiconductor substrate is furthermore known from document US-A1-2004/152258. This publication proposes a different method for electrical connection of the electrodes, by means of holes made in the electrodes themselves. More specifically, a given electrode, covered by an electrode superimposed thereon, is connected by a connection element passing through a hole formed in the electrode superimposed thereon. The holes must be sufficiently wide so as not to risk contact with the connection devices passing through and the installation accuracy of these contacts represents a genuine constraint. The active surface of the electrodes and hence the final electrical capacitance, is negatively affected.

An aim of the invention is therefore to describe a device and a production method providing a solution to this problem, advantageously by using conventional means employed by the microelectronic industry.

Other objects, characteristics and advantages of the present invention will appear during analysis of the following description and the accompanying drawings. It is understood that other advantages may be incorporated.

SUMMARY OF THE INVENTION

A first aspect of the invention concerns a multilayer electrical device comprising in succession on the surface of a substrate a first electrically conductive layer and at least one stack comprising an electrically insulating layer followed by a second electrically conductive layer, wherein the stack has a strictly smaller surface area than that of the electrically conductive layer immediately underneath and is contained within the boundary of said electrically conductive layer immediately underneath so as to form, in each electrically conductive layer, an exposed portion not covered by any stack, wherein the exposed portion runs over the entire outline of said electrically conductive layer.

Advantageously, the electrically conductive layer of at least one stack comprises an electrically insulating pattern configured in order to mark out a peripheral electrically insulated area located in the exposed portion of said electrically conductive layer.

Owing to the invention, a peripheral area of the conductive layer in question is insulated so as to no longer be active. Yet, this peripheral area is the site of potential defects, especially during etchings allowing, in the layers deposited, definition of the edges of the patterns to be formed (for example, in order to mark the outline of capacitor electrodes). More particularly, in the event that a sidewall etching were to result in redeposition of conductive material on the sidewalls of an insulating layer, which would cause electrical insulation faults, the electrically insulating pattern allows recovery of the insulation between the different layers and avoids the peak effect at the electrode tip in case of capacitances.

This additional pattern, preferentially forming a guard ring around each conductive layer, may be produced separately or be produced simultaneously with etching of the first conductive layer.

Preferably, the device comprises, for each electrically conductive layer comprising an electrically insulating pattern, an connection element in electrical continuity with a connection area located in the exposed portion of said electrically conductive layer, outside the insulated area, wherein the connection element of the electrically conductive layer immediately underneath passes through the electrically insulating layer of the stack in a region peripheral to the electrically insulated area of the exposed portion of said electrically conductive layer, said peripheral region being located on a side of the electrically insulated area opposite the electrically insulating pattern.

In this advantageous configuration, contact recovery is performed independently from the insulating patterns and in the exposed area. This facilitates manufacture of the contact restorations. On the one hand, there is no risk of short circuit between the connection elements and the active part of the conductive layers, as these elements pass along the side of these layers and not through the latter and moreover by solely skirting the insulated areas of the layers. It is therefore possible to make allowance for precision tolerances in manufacturing resolution of the connection elements, while assuring that the latter will not interfere with the electrically active parts of the layers. The integration density may on the other hand be greater, since the proportion of active surface of the superimposed layers is high.

Another aspect of the invention relates to a manufacturing method of a multilayer electrical device comprising formation in succession on the surface of
- a first electrically conductive layer,
- at least one stack comprising an electrically insulating layer followed by a second electrically conductive layer, wherein the stack is formed with a smaller surface area than that of the electrically conductive layer immediately underneath and is contained within the boundary of said electrically conductive layer immediately underneath so as to form, in each electrically conductive layer, an exposed portion not covered by any stack, wherein the exposed portion runs over the entire outline of said electrically conductive layer.

Advantageously, it comprises formation, in the electrically conductive layer, of at least one stack and an electrically insulating pattern configured in order to mark out a peripheral electrically insulated area located in the exposed portion of said electrically conductive layer. Furthermore, preferably, the method is such that it comprises, for each electrically conductive layer comprising an electrically insulating pattern, formation of a connection element in electrical continuity with a connection area located in the exposed portion of said electrically conductive layer, outside the insulated area, wherein the connection element of the electrically conductive layer immediately underneath is formed so as to pass through the electrically insulating layer of the stack in a region peripheral to the electrically insulated area of the exposed portion of said electrically conductive layer, said peripheral region being located on a side of the electrically insulated area opposite the electrically insulating pattern.

BRIEF DESCRIPTION OF THE FIGURES

The aims and objects in addition to the characteristics and advantages of the invention will be better apparent from the detailed description of an embodiment of the latter, which is illustrated by the following accompanying drawings in which.

Figure 1:
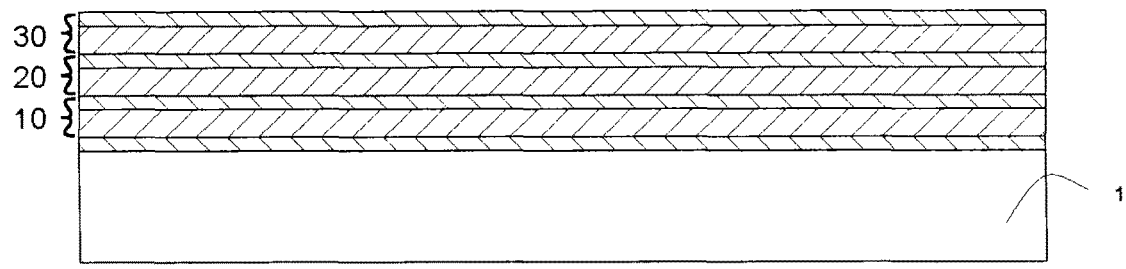
FIG. 1 illustrates a step of formation of several layers within the context of embodiment of the invention.

The drawings are provided by way of examples and are not limitative of the invention. They constitute schematic representations of the principle intended to facilitate understanding of the invention and are not necessarily at the scale of the practical applications. In particular, the relative thicknesses of the different layers do not necessarily reflect reality.

DETAILED DESCRIPTION OF THE INVENTION

Figure 7:
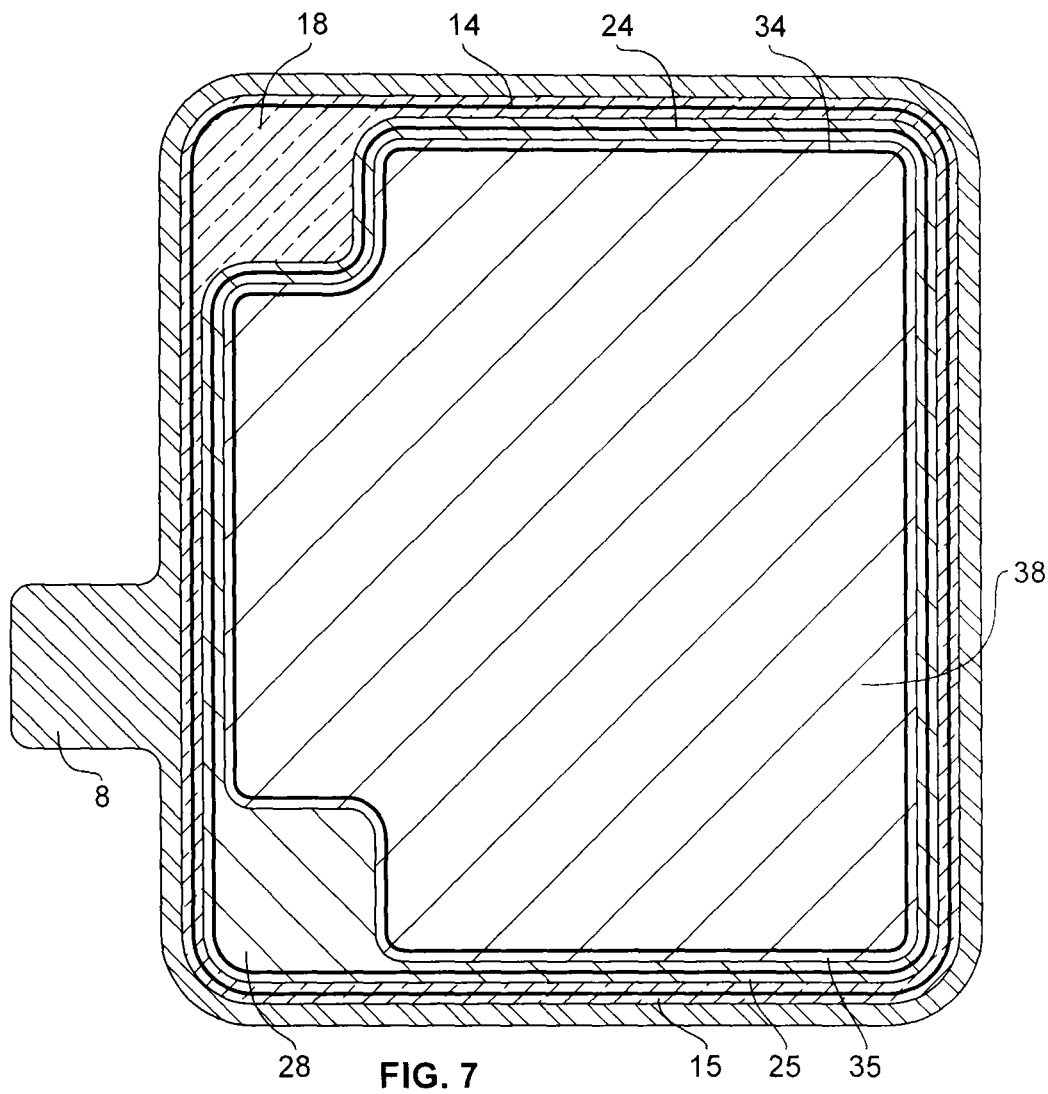
FIG. 7 presents, in a top view, the result obtained after the step in FIG. 6 and removal of the mask in FIG. 6.

Before starting on a detailed review of the embodiments of the invention, purely optional characteristics are mentioned below that may be used jointly if necessary in any combinations with each other or alternatively:

- the insulating pattern is a trench 14, 24, 34 with a closed outline formed in the entire thickness of said electrically conductive layer 12, 22, 32.
- the electrically conductive layer 12, 22, 32 of each stack 10, 20, 30 comprises an electrically insulating pattern configured in order to mark out a peripheral electrically insulated area 15, 25, 35 located in the exposed portion 8, 18, 28, 38 of said electrically conductive layer 12, 22, 32.
- the device comprises for each electrically conductive layer 12, 22, 32 comprising an electrically insulating pattern, a connection element 17, 27, 37 in electrical continuity with a connection area located in the exposed portion 8, 18, 28, 38 of said electrically conductive layer 12, 22, 32, outside the insulated area 15, 25, 35.
- the device comprises an electrically insulating layer 9 covering the whole of the electrically conductive layers 2, 12, 22, 32 through which (layer) the connection elements 17, 27, 37 pass.
- the outline of said electrically conductive layer comprises a portion parallel to the outline of the electrically conductive layer immediately underneath and a setback portion relative to the outline of the electrically conductive layer immediately underneath: hence, the outlines of two successive conductive layers partially have the same profile, with homothetic shapes decreasing in size as the stacks are superimposed; this part with the same outline may represent the major portion of the perimeter of the conductive layers; another part does not have the same outline, i.e. the conductive layer above comprises a set-back part (for example, by forming a concave section of the profile of the outline of the layer in question) relative to the outline of the layer underneath; this set-back part forms a portion in which the exposed area of the electrically conductive layer underneath is greater than the remainder of the outline of the layer; this portion may be the site of connection, by the outside of the conductive layers and only limiting to a minor degree the active surfaces of the conductive layers.

the connection area of the layer immediately underneath is executed so as to be situated at the level of the set-back portion; this makes it possible to limit to a single portion (that having the set-back area, an example of which is visible in a top view in FIG. 7), the surface of the exposed area (outside the insulated area) of the layer to be connected, which must be of sufficient size in order to receive the contact of the connection element. The remainder of the conductive layers are therefore in a facing arrangement to a great extent in order to avoid penalising the active surfaces of the stack. The location of the elements for recovery of contact at the level of the set-back areas is visible in FIG. 10.

The process may be such that formation of the insulating pattern comprises formation of a trench 14, 24, 34 with a closed outline formed in the entire thickness of said electrically conductive layer.

the trench 14, 24, 34 is formed by use of a mask defining a trench pattern followed by etching of a trench 14, 24, 34 outside the mask in said electrically conductive layer.

An electrically insulated pattern configured in order to mark out a peripheral electrically insulated area 15, 25, 35 located in the exposed portion 8, 18, 28, 38 of said electrically conductive layer 12, 22, 32 is formed for the electrically conductive layer 12, 22, 32 of each stack 10, 20, 30.

the trenches 14, 24, 34 of the electrically conductive layers 12, 22, 32 are formed during the same masking and etching steps.

the process comprises, for each electrically conductive layer 12, 22, 32 comprising an electrically insulating pattern, formation of a connection element 17, 27, 37 in electrical continuity with a connection area located in the exposed portion 8, 18, 28, 38 of said electrically conductive layer 12, 22, 32, outside the insulated area 15, 25, 35.

the process comprises formation of an upper electrically insulating layer 9 covering the whole of the electrically conductive layers 2, 12, 22, 32 through which (layer) the connection elements 7, 17, 27, 37 pass.

formation of a connection element 7, 17, 27, 37 is executed by etching a pattern of connection elements through the upper electrically insulating layer 9, depositing a layer of an electrically conductive material on top of the upper electrically insulating layer and in said patterns and subsequently etching the layer of electrically conductive material in order to define the connection elements 7, 17, 27, 37.

the etching of the layer of an electrically conductive material is configured in order to insulate at least two connection elements electrically against each other.

formation of the first electrically conductive layer 2 and of the at least one stack 10, 20, 30 comprises:

successive full-plate deposits, starting from the surface of substrate 1, of a layer for formation of the first electrically conductive layer 2 and of as many alternations of electrically conductive layers and insulating layers as the number of stacks 10, 20, 30, for each stack 10, 20, 30, starting with the uppermost stack 10, 20, 30 on top of the surface of the substrate 1, use of a mask defining a pattern of said stack 10, 20, 30 and etching of the layers of the alternation corresponding to said stack 10, 20, 30 outside the mask, wherein said etching is configured in order to preserve the stack 10, 20, 30 immediately underneath said stack 10, 20, 30 or the layer for formation of the first electrically conductive layer 2, after formation of all the stacks 10, 20, 30, use of a mask defining a pattern of the first electrically conductive layer 2 and etching of the layer for formation of the first electrically conductive layer outside the masking 4, the use of a mask defining a pattern of the first electrically conductive layer 2 and the use of a mask defining the patterns of the trenches 14, 24, 34 are executed during the same step and etching of the layer for formation of the first electrically conductive layer and etching of the trenches 14, 24, 34 during the same step.

It is pointed out that within the context of the present invention, the terms "on" or "above" do not obligatorily mean "in contact with". Therefore, intervening layers or intermediate bodies for example may be present.

Generally speaking, height implies a dimension situated according to the thickness of the substrate 1. The substrate 1 generally comprises two opposite sides around its thickness, wherein one of the sides is used for embodiment of the invention. This face is advantageously flat, along a plane advantageously perpendicular to the thickness of the substrate. The substrate 1 may be solid or multilayer in form and made of different materials such as conductive, insulating or semiconductive materials, for example silicon. The substrate 1 itself may comprise several layers. For example, the substrate 1 may comprise a superficial dielectric layer on top of which the succession of layers of the invention is executed. The substrate 1 may also incorporate bodies such as active or passive electrical elements. The substrate 1 is generally the support component serving during the steps of manufacturing the device and at least one part of which is advantageously retained following manufacture in order to participate in said device. It may be composed of or based on monocrystalline silicon and appear in the form of a thin slice generally described by the English word "wafer".

Electrically conductive signifies a conductivity material allowing performance a function of conducting electricity in application thereof. An electrically insulating material means a material, the electrical resistivity of which allows it, in its application, to serve as a barrier to conduction of electricity. The term dielectric is employed here with the same meaning.

The term pattern means all geometric configurations for which a hollow shape is embossed in the thickness of at least one layer of material. This pattern may be produced by a recess; especially by etching. The pattern may also be filled, with electrically insulating material for example.

Known methods of growth, deposition and etching of these materials and of all those, conductive or insulating, used in microelectronics are potentially employed, most frequently based on substrates. Definition of the patterns is performed in particular by photolithography, based on masks, photosensitive resins and by their insulation, but also potentially by other means.

One may typically resort to chemical etchings specific to each material, for example using a neutral plasma or also an etching of the reactive plasma type, which is formed in an etching reactor in which the devices to be etched are exposed to the reactive plasma. If a reactive plasma is used to execute the insulating trenches 14, 24, 34, the insulating layer of each stack may serve as an etching stop for the conductive layer of said stack.

It is to be noted here that the successive deposits of conductive and insulating materials are preferably adapted in order to be consistent, i.e. they allow achievement of appreciably equal deposition thicknesses over the entire layer in question. The layers formed may themselves consist of one or several sublayers.

The conductive materials capable of forming the conductive layers comprise in particular metals or their alloys used in microelectronics: aluminium (Al), gold (Au), copper (Cu), platinum (Pt) and potentially all kinds of materials that are naturally conductive or rendered conductive, particularly by doping such as semiconductor materials and in particular doped silicon or conductive oxides. These materials may be deposited, depending on the material, using any one of the methods commonly used by the microelectronic industry and most frequently denoted by the terms: PVD, CVD, PECVD, ALD and ECD, English acronyms corresponding respectively to "physical vapour deposition", "chemical vapour deposition", "plasma-enhanced chemical vapour deposition", "atomic layer deposition" and "electrochemical deposition". Deposition may also be performed by "spin coating", i.e. by centrifugation of the material deposited in liquid or viscous form on the surface of the substrate. The thicknesses deposited are typically included within a range of values of between 10 nm (nanometers, i.e. $10.10^{-9}$ meters) and 2 µm.

The materials usable in order to form all or part of the dielectric elements of the invention include for example silicon (Si) and its oxide (SiO2) or nitride (SiN), which are insulators. Other examples are listed below: alumina (Al2O3), hafnium oxide (HfO2), ceramics such as lead zirconate titanate (PZT) or barium and strontium titanates (BST). They are deposited for example using the same methods as those mentioned above or furthermore by PLD, the English acronym for "pulsed laser deposition". The thicknesses deposited are typically included within a range of values of between 10 nm (nanometers, i.e. $10.10^{-9}$ meters) and 2 µm. By way of an additional example, the insulating layers may be formed by chemical deposits or treatments and particularly oxidation or nitriding. Hence, the deposition phases may for example be limited to creation of the conductive layers and subsequently, between each deposit, a section of the thickness thereof is treated in order to create insulating layers.

According to the invention, a succession of insulating layers and conductive layers is created. It described in more detail later how this succession preserves in at least one conductive layer a portion not covered by other layers in the succession, particularly by layers on top thereof, more particularly by the upper conductive layers. This portion not covered by other layers is again known as the exposed portion here. In the invention, the exposed portion advantageously runs along the entire outline of the layer comprising this portion, so that in the case described with reference to the figures, a peripheral portion of the layer is involved, wherein said peripheral portion is exposed, i.e. not covered by any stacks possibly on top thereof. The term "exposed" does not necessarily mean that the portion in question is ultimately not covered. This may in particular be the case, at least partially, with a layer of insulating covering. The term "exposed" therefore solely means in a manner relative to the stacks of the invention.

FIGS. 1 to 5 show an initial phase of the method of the invention, allowing a mesa structure to be obtained on the surface of the substrate 1.

In FIG. 1, one begins by depositing a succession of layers starting from a face of the substrate 1. This succession of layers is preferentially obtained by a full-plate deposition method, by following for example the deposition technologies described above. The succession of layers initially comprises a first electrically conductive layer 2. In the case of capacitance, this layer 2 is capable of forming a lower electrode.

One or several stacks are created on top of the first layer 2. In the example in the figures, 3 stacks are formed successively 10, 20, 30 on top of the first layer 2. Each stack 10, 20, 30 comprises at least one electrically insulating layer 11, 21, 31 serving to insulate two conductive layers in succession.

Examples of usable materials have been given above both for the conductive layers and for the insulating layers.

Figure 2:
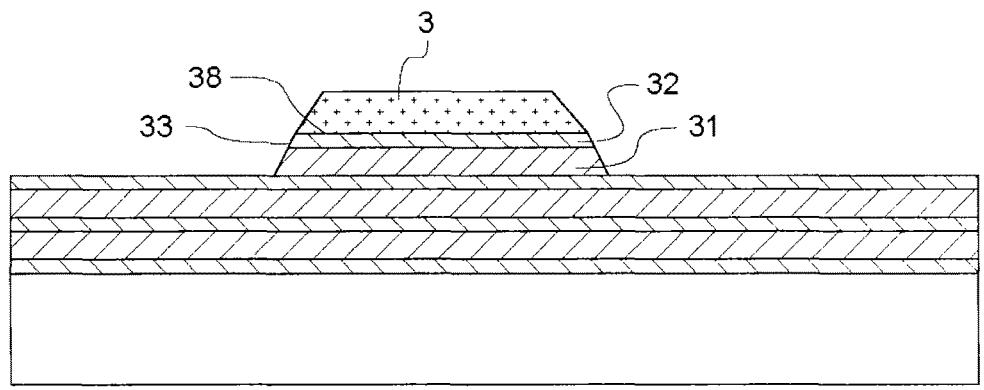
FIG. 2 shows a lithography and etching step with a view for forming a stack.

The step in FIG. 2 shows an embodiment for defining the final configuration of the stacks, starting with the uppermost stack marked 30. This step for example produces an upper electrode from the stack 30 in the case of a capacitance. A mask 3 is employed in order to mark out an etching pattern and more specifically in order to mark out a surface portion of the stack 30 not to be eliminated by the etching.

Conventional photolithography methods may be applied. The etching employed is configured in order to preserve (at least partially) the electrically conductive layer 22 located under the stack 30. The etching kinetics may in particular be adapted for this purpose.

The result of FIG. 2 is an upper stack 30, the outline of which is defined by a sidewall 33.

Figure 3:
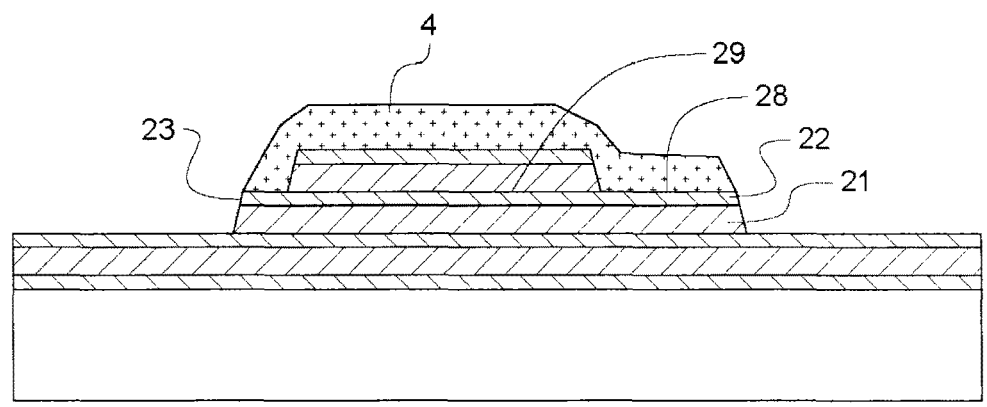
FIGS. 3 and 4 show successive steps similar to that of FIG. 2.
Figure 4:
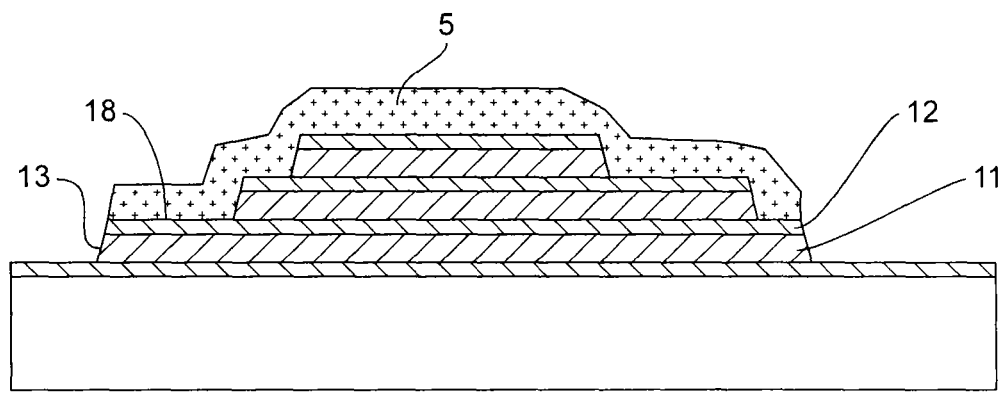

The following steps of FIGS. 3 and 4 are relatively similar to that of FIG. 2. Hence, in FIG. 3, the outline of the second stack 20 is created by an etching outside an area covered by a mask 4, the shape of which delimits the sidewall 23 of the stack 20. Likewise, FIG. 4 shows creation of the stack 10, in this case the lower stack, by means of an etching outside an area marked out by a mask 5. The definition method of the masks 3, 4, 5 may be identical.

As in the case of etching of the stack 30, measures are taken to preserve the following electrically conductive layer (12 followed by 2) during the etchings of the stacks 20 and 10.

Figure 5:
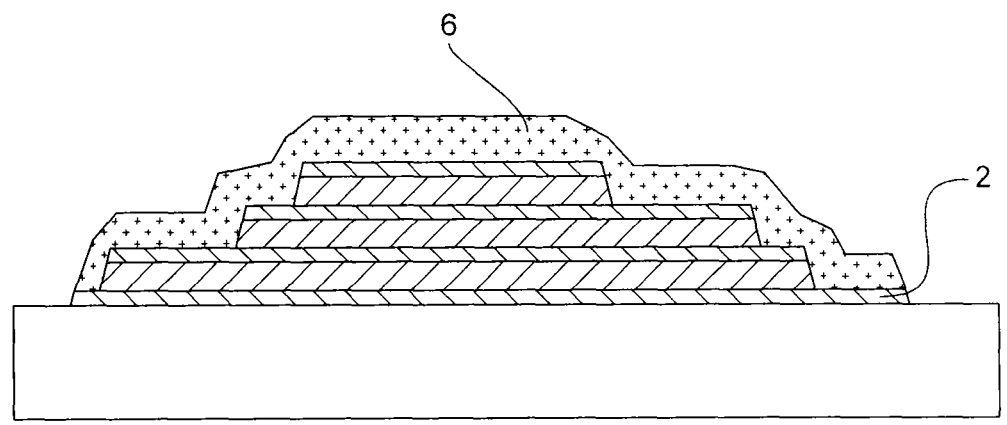
FIG. 5 presents a lithography and an etching of an electrically conductive base layer, forming a first layer on the surface of the substrate.

Lastly, in FIG. 5, definition of the multilayer system is finalised by delimitation of the first electrically conductive layer 2.

In summary, in the example illustrated, full-plate deposits followed by lithography and by etchings of similar designs may be sufficient in order to create this structure.

This structure is furthermore of a geometric configuration suitable for connection at a side projection of each electrically conductive layer.

The masks 3, 4, 5 and 6 and therefore the outline of the layers 2, 12, 22 and 32 are indeed configured in order to preserve, for each of these layers 2, 12, 22, 32 an area, the surface of which is not covered by the remainder of the structure. This area constitutes a peripheral portion 8, 18, 28 of the layers located under the stack 30, which is itself accessible by its upper surface 38.

In order to preserve the peripheral portions 8, 18, 28, it is ensured that at each succession of lithography and etching steps, descending towards the face of the substrate, the stack 10, 20, 30 is created such that its surface area is smaller than that of the lower stack and that its outline is contained within that of the lower stack. This precaution is also taken for the outline of the surface area of the first conductive layer 2 relative to the first stack 10. Consequently, a peripheral exposed portion 8, 18, 28, not covered, is preserved.

By way of an illustration, an area of the layer 22 of the second stack 20 that (layer) is covered by the remainder of the device has been marked 29. The area 29 and the peripheral portion 28 are complementary to each other in forming the entire layer 22.

The multilayer structure thus produced may adopt various shapes. The top view of FIG. 7 offers an example thereof. It also shows the sectional narrowing undergone by the conductive layers 2, 12, 22, 32 that alternate in succession with the insulating layers 11, 21, 31. In FIG. 7, the peripheral portion 8 of the first layer 2 comes in the form of a lateral projection along the plane of the face of the substrate 1. The outline of the remainder of the first layer 2 is appreciably rectangular in this case. The outline of the layer 12 and of the remainder of the stack 10 is in turn also appreciably rectangular. The outline of the layer 22 and of the remainder of the stack 20 fits within the preceding outline with a set-back portion along the plane of the face of the substrate, leaving the portion 18 of the layer 12 uncovered.

Finally, the outline of the layer 32 and of the remainder of the stack 30 fits within that of the stack 20, with a set-back along the plane of the face of the substrate 1, leaving the portion 28 of the layer 22 uncovered.

Preferably, the peripheral exposed portion 8, 18, 28, not covered, of each intermediate conductive layer 2, 12, 22 is continuous according to the outline of the layer in question. Hence, the peripheral portion forms a closed, looped surface on the periphery of the layer.

Figure 6:
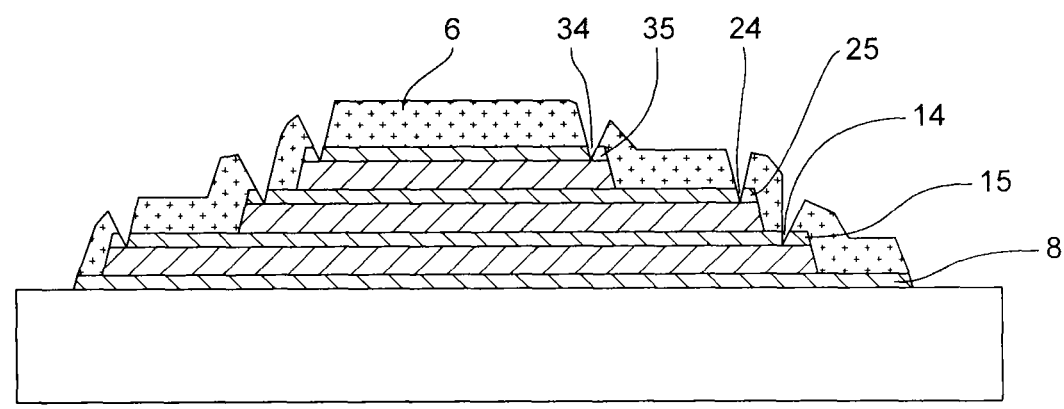
FIG. 6 illustrates creation of trenches in the electrically conductive layers.

Outline definitions, particularly by means of etchings, are employed by the invention in order to delimit the shape of the different layers. The etchings on the sidewalls 13, 23, 33 may create defects in the final device and cause electrical problems and/or shortfalls in performance. In order to rectify this, FIG. 6 illustrates formation of patterns serving to electrically insulate the part of the conductive layers 12, 22, 32 liable to be negatively affected by the defect.

More specifically, the peripheral portion of each (or at least one) conductive layer 12, 22, 32 of the stacks 10, 20, 30 comprises a pattern configured in order to differentiate an insulated area 15, 25, 35 from the remainder of the conductive layer 12, 22, 32. The pattern advantageously comprises a trench 14, 24, 34 creating a recess over the entire thickness of the conductive layer on which it is formed. The space thus created performs electrical insulation. It may furthermore be subsequently filled with a dielectric material. The insulation pattern is located in the peripheral exposed portion (uncovered) 18, 28, 38 of the conductive layer 12, 22, 322. For the layer 32, the exposed portion 38 may in practice over the entire surface of the layer 32, if this layer does not have a further conductive layer superimposed thereon. The pattern furthermore follows the entire outline of the layer 12, 22, 32 on which it is formed, so as to completely separate the insulated area 15, 25, 35. The area 15, 25, 35 forms the periphery or furthermore the external outline of the conductive layer in question. It constitutes a border with a closed outline, resembling a ring, around the remainder of the conductive layer 12, 22, 32.

The trench 14, 24, 34 of the layers 12, 22, 32 may be created during an etching step following creation of a mask 6 for defining the trench patterns in particular by photolithography. The mask 6 of the step of etching the first layer 6 may be used, or two successive masks may be formed followed by successive etching. The trench and the insulated area may have a width of between 0.5 and 5 μm respectively.

The result obtained is definition of an active (i.e. electrically effective) part in the conductive layers 12, 22, 32, by having eliminated an insulated area thereof 15, 25, 35 bordered by the sidewalls 13, 23, 33 of the stacks. At the same time, an area belonging to the active part of the layer and simultaneously uncovered, for connection, is preserved in the peripheral exposed portion 8, 18, 28, 38 of the conductive layers.

Figure 8:
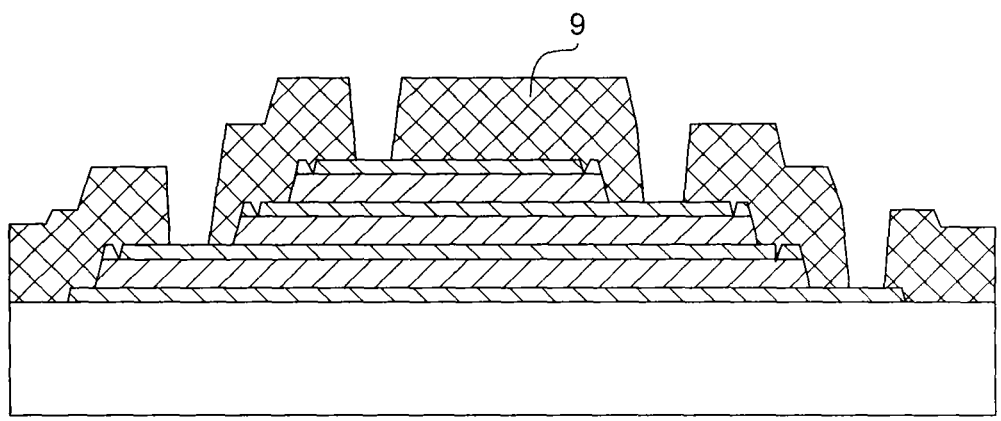
FIG. 8 represents formation of an upper insulating layer and orifices in this layer.
Figure 9:
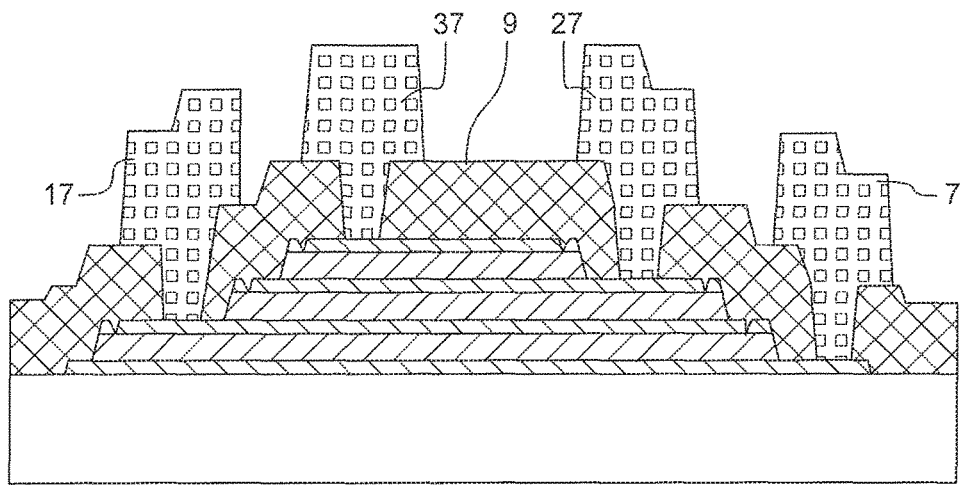
FIG. 9 shows, following FIG. 8, creation of connection elements through the orifices.

These contact restorations may be produced following deposition of an upper insulating layer 9 and creation of orifices in this layer 9 (by photolithography and etching for example), as visible in FIG. 8. Advantageously, this layer 9 also fills the trenches 14, 24, 34.

Connection elements 7, 17, 27, 37 may subsequently be formed. In particular, a conductive material, for example a connection metal such as titanium, nickel, gold or aluminium with an indicative thickness of 0.5 to 2 μm is deposited on the layer 9 and in the orifices. This layer is subsequently etched in order to obtain the connection elements 7, 17, 27, 37. Some thereof may be connected or in one piece starting from the connection layer deposited in order to form interconnections (for example those marked 16 and 26 in FIG. 10) between the conductive layers.

Figure 10:
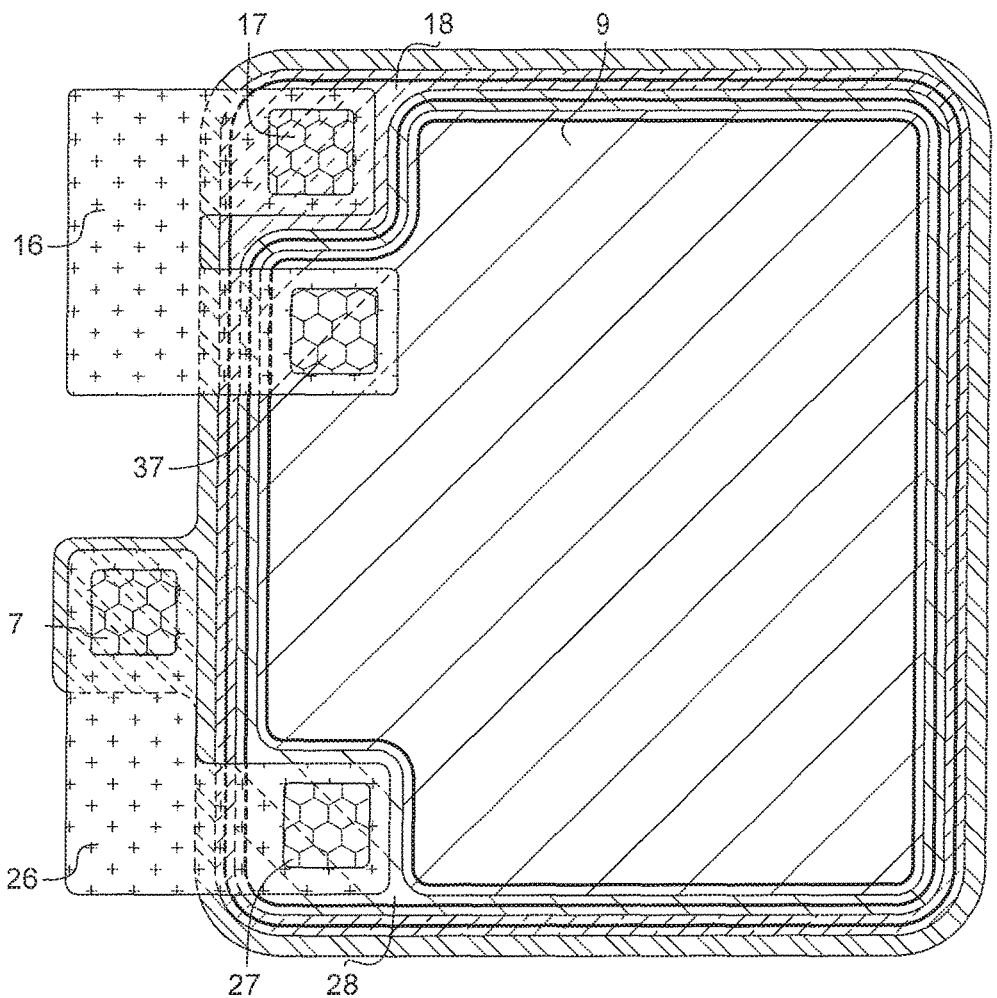
FIG. 10 is a top view corresponding to the cross-sectional view in FIG. 9.

Thus, FIG. 10 shows a capacitance by means of an MIM stack with connection of the electrodes corresponding to layers 2 and 22 on the one hand and the electrodes corresponding to layers 12 and 32 on the other hand.

The method according to the invention therefore allows the individual contact restorations on each of the conductive layers. Hence, any possible electrical configuration of the individual capacitances may potentially be realised and in particular, arrangement of the latter in parallel in order to obtain the maximum capacitances for a given occupied area.

Apart from the routing applications described in the introduction, the multilayer structures according to the invention may be advantageously used in the form of capacitances, particularly of high density, such as energy accumulators or filtering elements in many electronic products such as integrated electrical supplies, signal amplifiers, radiofrequency (RF) circuit filters and for all kinds of domestic applications, or by the automobile industry and that of telecommunications in which miniaturisation brings advantages in terms of reliability and reduction in costs. The devices that may be formed may fall within so-called MEMS microelectromechanical-type systems. This type of device may be found in products of a domestic, automobile, telecommunications or other type in which miniaturisation brings advantages in terms of reliability and reduction in costs.

The present invention is not limited to the embodiments described above and extends to any embodiment covered by the claims.

The invention claimed is:

1. A multilayer electrical device comprising successively on a surface of a substrate (1):
    a first electrically conductive layer,
    at least one stack comprising an electrically insulating stack layer and an electrically conductive stack layer formed on the electrically insulating stack layer, wherein each stack is formed with a strictly smaller surface area than that of an electrically conductive layer immediately underneath the stack and is contained within a boundary of said electrically conductive layer immediately underneath the stack, so as to form, in each electrically conductive layer, an exposed portion not covered by any stack, wherein the exposed portion surrounds the entire outline of said stack, wherein the electrically conductive stack layer of at least one stack comprises an electrically insulating pattern configured to define a peripheral electrically insulated area located in the exposed portion of said electrically conductive stack layer, said multilayer electrical device comprising for each electrically conductive stack layer having an electrically insulating pattern, a connection element in electrical continuity with a connection are located in the exposed portion f said electrically conductive stack layer, separate from the electrically insulated area, wherein a connection element of a conductive layer immediately underneath the electrically conductive stack layer having an insulating pattern is passing through the electrically insulating stack layer of the stack in a peripheral region peripheral to the electrically insulated area of the exposed portion of said electrically conductive stack layer, said peripheral region being located on a side of the electrically insulated area opposite to a side of the electrically insulated area adjacent to the electrically insulating pattern.

2. The device according to claim 1, wherein the electrically insulating patter is a trench with a closed outline formed in the entire thickness of said electrically conductive layer.

3. The device according to claim 1, wherein the electrically conductive layer of each stack comprises an electrically insulating pattern configured in order to mark out a peripheral electrically insulated area located in the exposed portion of said electrically conductive layer.

4. The device according to claim 1, wherein the outline of said electrically conductive layer comprises a portion parallel to the outline of the electrically conductive layer immediately underneath and a set-back portion relative to the outline of the electrically conductive layer immediately underneath.

5. The device according to claim 4, wherein the connection area of the layer immediately underneath is situated at the level of the set-back portion.

6. The device according to claim 1, comprising an electrically insulating layer covering all the electrically conductive layers through which the connection elements pass.

* * * * *